United States Patent [19]
Wolaver

[11] Patent Number: 5,321,369
[45] Date of Patent: Jun. 14, 1994

[54] WIDE-RANGE, WIDE-BANDWIDTH, HIGH-SPEED PHASE DETECTOR

[75] Inventor: Dan H. Wolaver, West Brookfield, Mass.

[73] Assignee: Microwave Logic, Inc., Chelmsford, Mass.

[21] Appl. No.: 920,791

[22] Filed: Jul. 28, 1992

[51] Int. Cl.⁵ .................................. H03D 13/00
[52] U.S. Cl. ................................ 328/133; 307/514; 307/516
[58] Field of Search ............ 328/133, 134, 109; 307/511, 514, 516

[56] References Cited

U.S. PATENT DOCUMENTS 4,721,905  1/1988  Mehrgardt .................. 328/133
4,797,625  1/1989  Nakazawa .................. 328/133

Primary Examiner—Andrew M. Dolinar
Attorney, Agent, or Firm—William D. Roberson

[57] ABSTRACT

The phase range of a phase detector is extended while maintaining its modulation bandwidth and linearity. The range is widened by dividing down the frequencies to be compared. Clocked delay lines create sequentially delayed multiple-phase signals which are applied to a plurality of component phase detectors. The outputs of each of the component phase detectors are summed to restore the frequency of the original clock signals to the output components. This technique is especially useful in high-speed phase detectors.

5 Claims, 4 Drawing Sheets

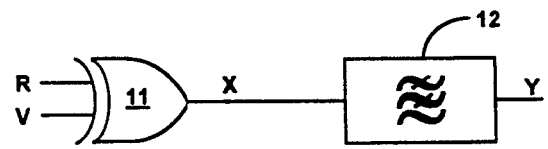
Fig. 1a  *Prior Art*
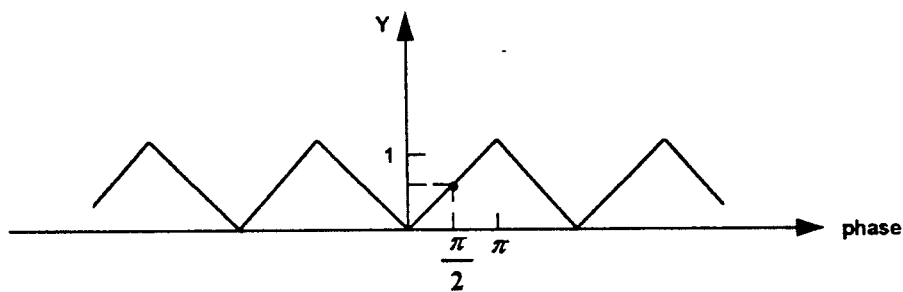
Fig. 1b  *Prior Art*
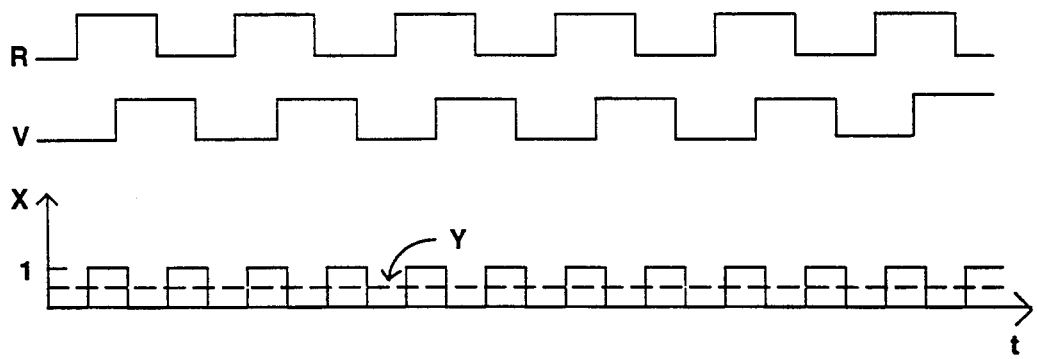
Fig. 1c  *Prior Art*

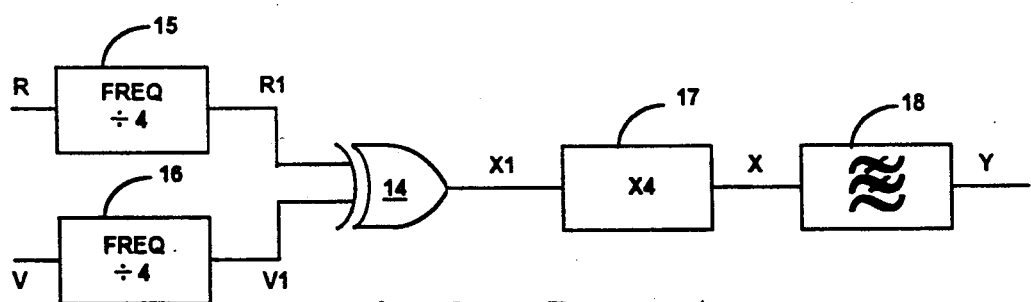
Fig. 2a  *Prior Art*
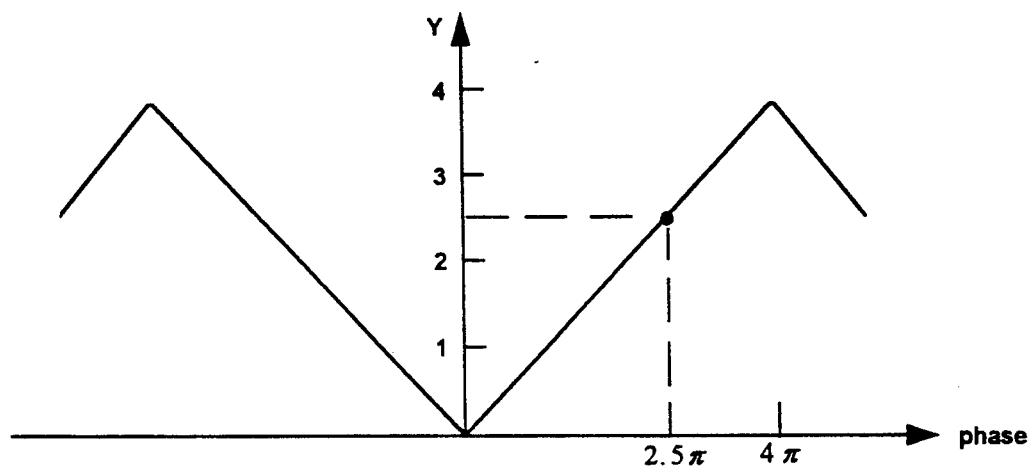
Fig. 2b  *Prior Art*
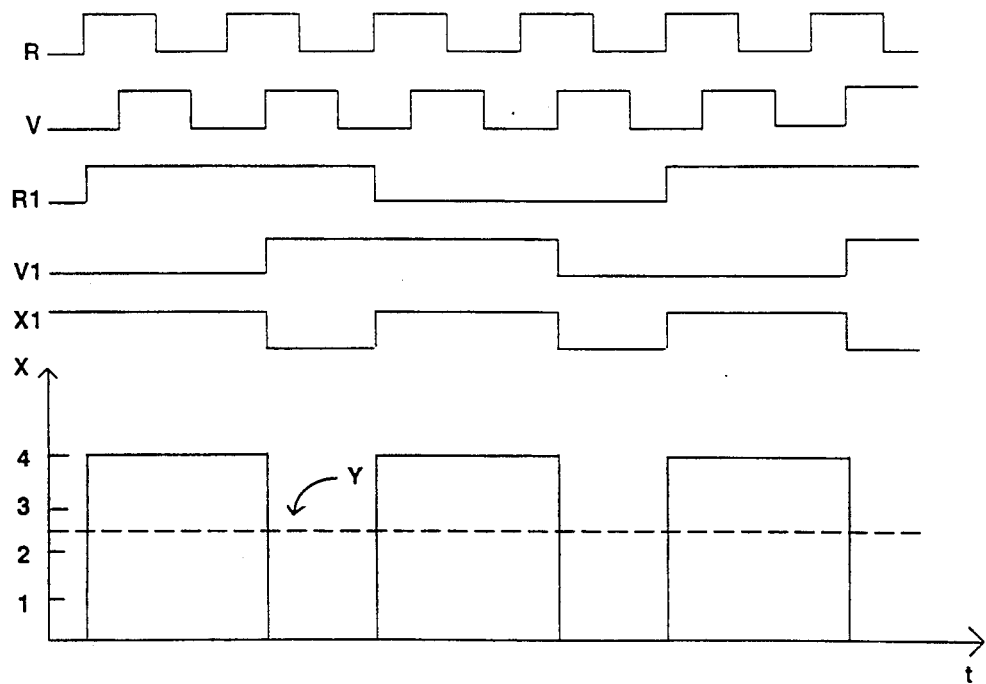
Fig. 2c  *Prior Art*

WIDE-RANGE, WIDE-BANDWIDTH, HIGH-SPEED PHASE DETECTOR

This invention relates to phase detectors of high speed and wide band which have an extended range for comparing the relative phases of high frequency clock signals. Wide phase range is achieved without reducing the phase detector bandwidth, i.e. the frequency of the phase signals which can be modulated and demodulated. The invention is applicable to all types of phase detectors, both high-speed phase detectors and slower ones which employ feedback in their design.

BACKGROUND OF THE INVENTION

On pages 47 to 79 of my textbook *Phase-Locked Loop Circuit Design*, published 1991 by Prentice Hall, Inc. of Englewood Cliffs, N.J., I describe a number of prior art phase detectors which constitute some of the background of this invention, some of which are described herein with reference to FIGS. 1a through 3c.

In *Generalized Phase Comparators for Improved Phase-Locked Loop Acquisition*, IEEE Transactions on Communication Technology, Volume COM-19, No. 6, pp. 145-148, December 1971, the author James F. Oberst explains a technique to realize a wide-range, wide-bandwidth phase detector, but which introduces nonlinearities in the detector's response, a problem which Oberst recognized. The nonlinearities become especially pronounced with high-speed clock signals.

In my U.S. Pat. No. 4,902,920 issued on Feb. 20, 1990, for "Extended Range Phase Detector," I disclose a wide-range, wide-bandwidth, linear phase detector, which utilizes a three-state phase detector. The feedback loop of that phase detector, however, prevents it from handling high-speed clock signals

SUMMARY OF THE INVENTION

The present invention presents a wide-range, wide-bandwidth, linear phase detector which does not rely on a slow phase detector in its design. It handles high-speed clock signals. The following description shows how a phase detector constructed in accordance with this invention can have an extended phase range without a reduction in its modulation bandwidth.

The wide-range phase detector has two input clock signals applied to it. From each input clock signal is generated a number of multiple-phase clock signals, each with the same frequency-some fraction of the input clock frequency. The generating means may be a ring counter, a Johnson counter, or a combination of a frequency divider and a clocked delay line. There is a series of multiple-phase clock signals for each input clock signal. Corresponding phases from the two series of multiple-phase clock signals are applied to narrow-range phase detectors, each narrow-range phase detector receiving one of the multiple-phase clock signals from the first series and one of the multiple-phase clock signals from the second series. Each of the narrow-range phase detectors produces a raw output signal the average of which is proportional to the phase difference between the applied multiple-phase clocks. The raw outputs are applied to a means that produces an output signal proportional to the sum of the raw outputs. This output signal is the output of the wide-range phase detector. Its average is proportional to the phase difference between the input clock signals. It may be desirable to apply the output signal to a low-pass filter, producing a filtered output signal that is the average of the output signal.

BRIEF DESCRIPTION OF THE DRAWINGS

FIG. 1a is a diagrammatic presentation of a simple prior art phase detector employing an exclusive-OR element;

FIG. 1b represents the output characteristic of the device of FIG. 1a;

FIG. 1c is a graph of various signals in the device of FIG. 1a;

FIG. 2a is a diagrammatic presentation of another prior art phase detector employing an exclusive-OR element;

FIG. 2b represents the output characteristic of the device of FIG. 2a;

FIG. 2c is a graph of various signals in the device of FIG. 2a;

FIG. 3b is a graph of various signals in the device of FIG. 3a; and

DETAILED DESCRIPTION

Figure 3A:
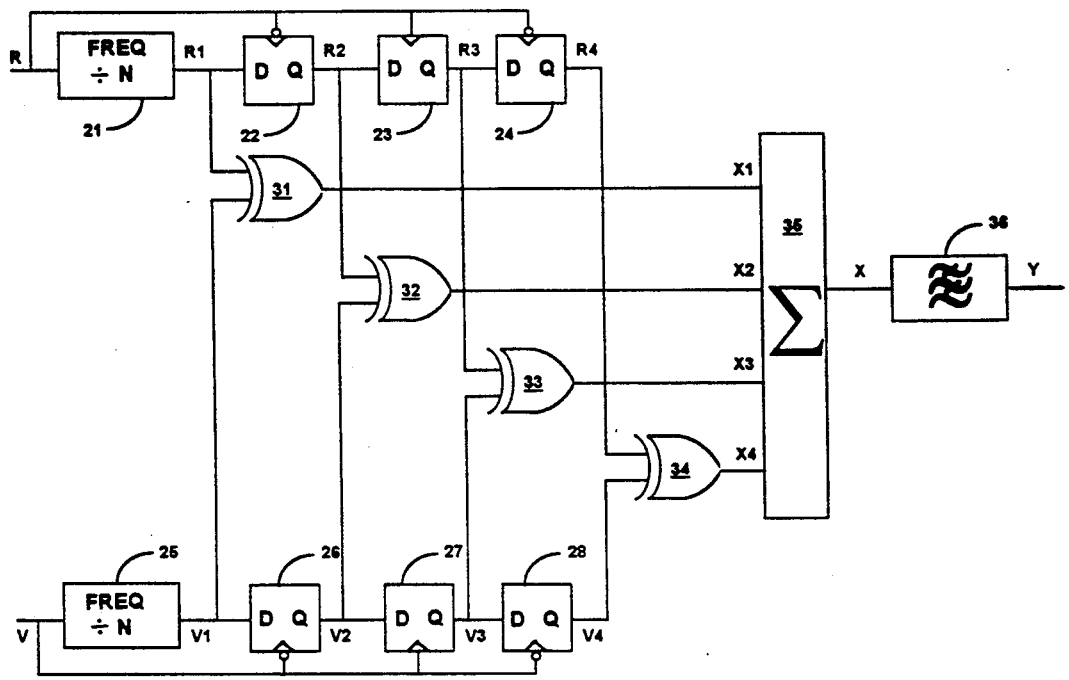
FIG. 3a is a diagrammatic representation of a preferred embodiment of a phase detector constructed in accordance with the principles of this invention to have a high speed, a broad bandwidth and an extended range.

The operation of a simple prior art phase detector is shown in FIG. 1. The exclusive-OR phase detector component 11 is chosen for the discussion because it comprises only combinational logic; it employs no feedback for its operation. Therefore it can respond quickly to the high-speed clock signals R and V at its input terminals. FIG. 1c shows that, as the relative phase of the input clock signals R and V changes, the width of pulses X appearing at the output of exclusive-OR gate 11 changes correspondingly. A low-pass filter 12 smoothes the pulses and extracts Y, the average value of output signal X.

The characteristic of output signal Y versus phase is shown in FIG. 1b. Output signal Y varies linearly with phase over a range of pi radians, or ½ cycle. As is true for all phase detectors, the characteristic is periodic, repeating every 2pi of phase here. The relative phase of R and V shown here is pi/2. The resulting output signal X characterizing the phase difference between the input signals has a height of 1 and a duty cycle of 50%. The average value Y extracted from the output signal X by the low-pass filter 12 is 0.5. It is to be noted that the components removed by the low pass filter 12 are at least 2fc, where fc is the frequency of the clock signals R and V. Therefore the low-pass filter 12 can perform its function with a bandwidth as high as fc. The demodulated phase signals X with frequencies up to fc can pass through the low-pass filter 12 giving the phase detector a wide bandwidth.

FIG. 2a shows another prior art phase detector in which the phase range of the exclusive-OR phase detector component 14 is extended four-fold by using two frequency dividers 15 and 16. While input clock signal R has a frequency fc, the intermediate input signal R1 from frequency divider 15 has a frequency fc/4 with one rising edge for every four rising edges of the original input signal R. A similar relationship holds for input clock signal V and intermediate input signal V1 from frequency divider 16. The X1 of the exclusive-OR device 14 is amplified by four by amplifier 17 to produce intermediate output signals output signal X=4×X1. necessary to the operation, but it simplifies comparisons later.) As can be seen in FIG. 2c, because the signals R1 and V1 have been stretched four-fold in time, X1 and X have also been stretched four-fold in time, and the characteristic shown in FIG. 2b has also been stretched four-fold in phase; the linear range of the characteristic is now 4pi rather than pi. The low pass filter 18, shown in FIG. 2a, extracts an average value for the output signal Y, which is 2.5 for the phase 2.5pi shown here in FIG. 2b.

The drawback of this particular device is that the frequency of X is now one-fourth as great, fc/2 rather than 2fc. To reject this frequency in extracting the average, the low pass filter 18 of FIG. 2a can have a bandwidth no greater than fc/4, reducing the bandwidth of the phase detector.

The present invention makes it possible to preserve the wide range of a phase detector, as in FIG. 2, while regaining the high frequency response characterizing signal X in FIG. 1. One way to accomplish this is shown in the preferred embodiment represented in FIG. 3a. The frequency divider 21 operating on input clock signal R is followed by a series of flip-flops 22, 23, and 24 clocked by the input signal R. These define a clocked delay line that produces respective frequency-divided intermediate input signals R1, R2, R3, and R4, each successive one in the series being delayed by the same increment, here shown as a half clock cycle, from the previous one. The increment of delay need not be as small as a single half clock cycle; whole number multiples of a half clock cycle can also be used. In a similar manner, another frequency divider 25 and the sequential series of flip-flops 26, 27, and 28, in effect another clocked delay line, are clocked by the other input clock signal V to produce a series of respective frequency-divided intermediate input signals V1, V2, V3, and V4, each successively delayed by the same half clock cycle from the previous one. Sequential pairs of the delayed signals are phase-compared by four component narrow-range phase detectors shown here as exclusive-OR gates, 31, 32, 33, and 34.

These component phase detectors produce a series of intermediate output signals X1, X2, X3, and X4, each successively delayed by a half clock cycle from the previous one. These four intermediate output signals X1, X2, X3, and X4 are summed by summing circuit 35 to produce the output signal X, represented in FIG. 3b, to characterize the phase relationship between the two input clock signals. A low-pass filter 36 smoothes the output pulses and extracts Y, the average value of the final output signal X.

Figure 3B:
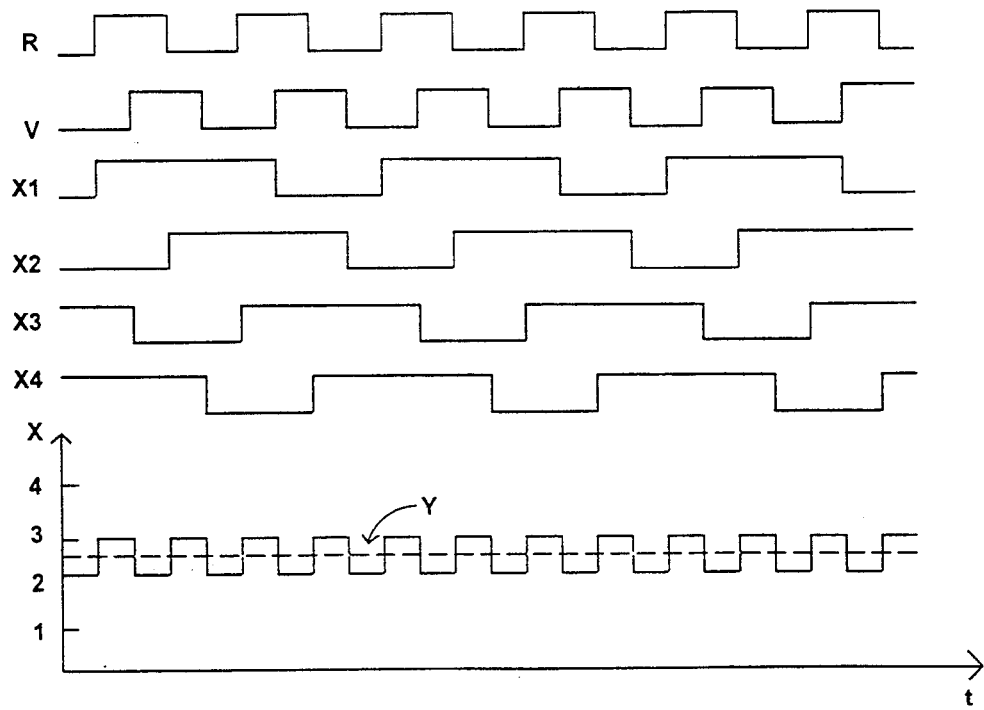

The relationships between the various signals applied to and produced by the phase detector of FIG. 3a are shown in FIG. 3b. As in the previously discussed prior art examples the input signals are offset by a phase difference to be determined. The frequency-divided intermediate output signals X1, X2, X3, and X4 are sequentially offset each from the other by a phase difference of a half cycle of an input clock signal or a whole number multiple of a half cycle of the input clock signal frequency. It is to be noted that the average value of the final output signal Y from summing circuit 35 in FIG. 3c is the same as that shown in FIG. 2c, but the frequency of X is 2fc as in FIG. 1. Therefore the phase range of the phase detector provided by this invention has been extended to 4pi while retaining a bandwidth of fc.

Figure 4:
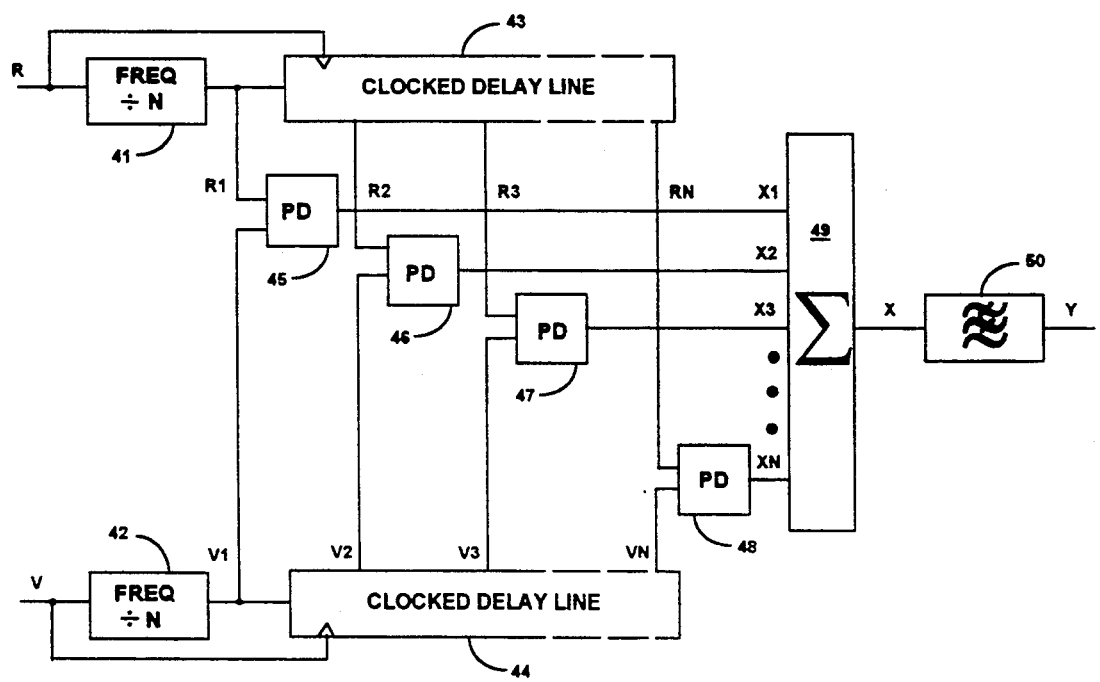
FIG. 4 is a diagrammatic presentation of a more generalized phase detector constructed in accordance with the principles of this invention.

The present invention is presented in a more general way by the schematic diagram of FIG. 4. Two respective frequency dividers 41 and 42 reduce the frequency of input clock signals R and V by a factor of 1/N. Two clocked delay lines 43 and 44 each produce N intermediate input signals, each successive one being delayed in time from the previous one by the same increment. The delay intervals between signals successive signals R1, R2, R3 . . . RN must be equal, preferably by half a clock cycle, but any multiple of a half clock cycle can be used. The same is true, of course, for signals V1, V2, V3 . . . VN. The total delay must be N/2 clock cycles for exclusive-OR or multiplying phase detectors; it must be N clock cycles for rising-edge-triggered phase detectors. The phase differences of Rn-Vn signal pairs are compared by a number N of component narrow-range phase detectors 45, 46, 47, and 48, where the component phase detectors are of any desired design, but all of the same type. The intermediate output signals of the phase detectors 45, 46, 47 and 48 are summed in an analog sense by summing circuit 49 to produce output signal X characterizing the phase relationship between the two input clock signals, which output signal is then averaged by a low pass filter 50.

It is to be noted that the delay lines may not be analog; they must be clocked. Otherwise phase information present in the clock edges removed by the frequency dividers would be lost. A frequency divider and a clocked delay line can be combined in one circuit such as a Johnson counter.

The invention provides a phase detector with a range N times that of each component narrow-range phase detector, the same bandwidth as each component phase detector, the same linearity as each component phase detector, and the same speed as (or greater than) each component phase detector.

It will be clear that this invention is not limited in its broadest realization to the specific examples described herein, but that certain modifications, variations and substitutions within the principles of this invention, other than those already described, will occur to those skilled in the art of phase detection.

What I claim as new and intend to secure by Letters Patent of the United States is intended to be secured by the following claims.

1. A wide-range phase detector for measuring the phase relationship between first and second input clock signals comprising:
    means for generating in response to said first and second input clock signals a corresponding first and second series of multiple-phase clock signals, each with the same frequency fractionally related to the frequency of said input clock signals, and each successive one of said multiple-phase clock signals being delayed by the same phase increment from the phase of the immediately preceding multiple-phase clock signal in its series;
    a plurality of narrow-range phase detectors, each responsive to a pair of corresponding signals from said first and second series to produce an intermediate output signal the average of which is proportional to the phase difference between the applied multiple-phase clock signals; and
    means for summing the intermediate output signals from each of said narrow-range phase detectors to produce a final output signal representative of the phase difference between the first and second input clock signals.

2. The phase detector of claim 1 wherein said generating means comprises:
   first and second means for dividing down said first and second input clock signals to produce derivative frequency-divided first and second intermediate input signals corresponding respectively to said first and second input clock signals; and
   first and second clocked delay line means responsive respectively to said first and second intermediate input signals for generating therefrom said first and second series of multiple-phase clock signals.

3. The phase detector of claim 2 wherein each of said clocked delay line means comprises a series of flip-flops clocked by the input signal to produce said multiple-phase clock signals.

4. A phase detector of high speed and broad bandwidth having an extended range for comparing the phase of first and second primary input clock signals comprising:
   means for dividing down the frequencies of said first and second primary input clock signals to produce derivative frequency-divided first and second intermediate input signals corresponding respectively to said primary input clock signals;
   first and second clocked delay line means each responsive to a respective one of said input clock signals and to its derivative frequency-divided intermediate input signal to produce a series of multiple-phase clock signals, each with the same frequency fractionally related to the frequency of said input clock signals, and each successive one of said multiple-phase clock signals being delayed by the same phase increment from the phase of the immediately preceding multiple-phase clock signal in its series;
   a plurality of narrow-range phase detectors, each responsive to a pair of corresponding signals from said first and second series to produce an intermediate output signal the average of which is proportional to the phase difference between the applied multiple-phase clock signals; and
   means for summing the intermediate output signals from each of said narrow-range phase detectors to produce a final output signal representative of the phase difference between the first and second input clock signals.

5. A phase detector of high speed and broad bandwidth having an extended range for comparing the phase of first and second primary input clock signals comprising:
   a first channel comprising means responsive to said first primary input clock signal for dividing down the frequency of said first primary input clock signal and producing therefrom a first series of frequency-divided intermediate input signals, each sequential cycle of which is delayed from the preceding one by an interval of one or more half clock cycles of the primary input clock signals;
   a second channel comprising means responsive to said second primary input clock signals for dividing down the frequency of said second primary input clock signal and producing therefrom a second series of frequency-divided intermediate input signals, each sequential cycle of which is delayed from the preceding one by an interval of one or more half clock cycles of the secondary input clock signals;
   a plurality of narrow-range component phase detectors each responsive to a corresponding pair of said intermediate input signals from said first and second channels to produce an intermediate output signal characterizing the difference in phase of such pair of intermediate input signals; and
   summing circuit means for combining the intermediate output signals of each of said component pMase detectors to derive therefrom a final output signal characterizing the difference in phase of said first and second primary input clock signals.

* * * * *